United States Patent [19]
Huber et al.

[11] Patent Number: 6,052,307
[45] Date of Patent: Apr. 18, 2000

[54] LEAKAGE TOLERANT SENSE AMPLIFIER

[75] Inventors: Brian W. Huber, Allen; Theodore T. Pekny, Dallas, both of Tex.

[73] Assignee: Texas Instruments Incorporated, Dallas, Tex.

[21] Appl. No.: 09/368,053

[22] Filed: Aug. 3, 1999

Related U.S. Application Data

[60] Provisional application No. 60/096,033, Aug. 11, 1998.

[51] Int. Cl.[7] .................................................. G11C 16/06
[52] U.S. Cl. ................................. 365/185.21; 365/185.2; 365/185.25; 365/185.3; 327/52; 327/53; 327/56
[58] Field of Search ........................... 365/185.21, 185.2, 365/185.25, 185.3; 327/52, 53, 56

[56] References Cited

U.S. PATENT DOCUMENTS

| | | | |
|---|---|---|---|
| 4,763,305 | 8/1988 | Kuo | 365/185.22 |
| 4,811,294 | 3/1989 | Kobayashi et al. | 365/185.22 |

*Primary Examiner*—Andrew Q. Tran
*Attorney, Agent, or Firm*—Robby T. Holland; Carlton H. Hoel; Frederick J. Telecky, Jr.

[57] ABSTRACT

A leakage tolerant sense circuit for use in an electrically programmable and erasable read only memory (EEPROM) is disclosed. In a reference portion of a sense cycle, the leakage tolerant sense amplifier utilizes the sum of a reference current and any leakage current to establish a reference voltage. In the subsequent sense portion of the sense cycle, the leakage tolerant sense amplifier utilizes the sum of a memory cell current and any leakage current to establish a read voltage. The read voltage is compared with the reference voltage to determine the logic stored within the memory cell.

36 Claims, 6 Drawing Sheets

LEAKAGE TOLERANT SENSE AMPLIFIER

This application claims priority under 35 USC §119(e)(1) of provisional application Ser. No. 60/096,033 filed Aug. 11, 1998.

TECHNICAL FIELD

The present invention relates generally to semiconductor memory devices, and more particularly to circuits for sensing current based data signals in memory devices, such as electrically programmable and erasable read only memories (EEPROMs).

BACKGROUND OF THE INVENTION

Read only memories (ROMs) typically serve as a nonvolatile source of data storage. Volatile memory devices, such as dynamic random access memories (DRAMs) and static random access memories (SRAMs) can store data, but once power is removed from such devices, the data is lost. In contrast, nonvolatile memory devices, such as ROMs, electrically programmable ROMs (EPROMs), and electrically erasable and programmable ROMs (EEPROMs) retain data in the absence of power. Many volatile memory devices sense the logic stored within a memory cell by detecting a change in voltage. For example, in the case of DRAMs, a charge is placed on a bit line to create a difference in voltage between the bit line and a reference voltage. In the case of SRAMs, an SRAM cell often includes circuitry for pulling a bit line to a higher or lower potential. In contrast, many nonvolatile memory devices sense memory cell stored logic by detecting current values. In the case of many EPROMs and EEPROMs, a programmed memory cell (typically logic "0") will draw negligible current, while an erased memory cell (typically logic "1") will draw a relatively large amount of current.

Nonvolatile memory devices commonly include an architecture in which memory addresses are applied to access a particular set of data. As in the case of most every other memory device, an important aspect to consider in the selection of such devices is the speed at which data can be read. Data is typically stored within thousands or millions of memory cells packed within a single device. Because of this, the data signal provided by an individual memory cell is typically a very small voltage or current signal. Because of this, a nonvolatile memory device includes sense amplifier circuits, for sensing the logic value of the memory cell signal, and amplifying the signal.

As noted above, in the case of EPROMs and EEPROMs, the memory cell signal is often a current signal. This arises out of the fact that many EPROMs and EEPROMs employ memory cells having floating gates that are used to alter the threshold voltage of an insulated gate field effect transistor structure. If the memory cell is programmed, the floating gate is charged, and when its respective transistor is accessed, the threshold voltage of the cell will be higher than the applied control gate voltage, that the cell will draw no (or negligible) current, establishing a logic "0." If the memory cell is not programmed (or in the case of an EEPROM, erased), the cell will draw current when accessed, thereby establishing a logic "1".

In addition to speed, another important concern in the design and manufacture of nonvolatile memory devices is that of yield and reliability. Yield refers to the number of functional devices that are produced at a given point in a manufacturing process. Because semiconductor memory devices are fabricated on silicon wafers as a number of individual die, yield is often referred to as the number of "good" die per wafer. It is noted however, the yield can also refer to "back-end" portions of the manufacturing process in which individual dies are placed in packages and subjected to other process steps, such as "burn-in." Reliability refers to the ability of the memory device to operate without failing over time. Therefore, although a device may appear fully functional, over time the device may fail.

Yield is important in the fabrication of semiconductor devices, as the process used in manufacturing nonvolatile devices, such as EPROMs and EEPROMs, can include manufacturing steps (for example those steps required to fabricate the memory cell) above and beyond those of conventional logic devices. Thus, there may be a greater chance that defects will be introduced during these process steps.

Reliability of EPROMs and EEPROMs is important, because nonvolatile memory devices are typically used to store important system information. In the event the EPROM or EEPROM is defective, incorrect data will be output by the nonvolatile memory device, resulting in erroneous performance of a system. As one example, EPROMs, and increasingly, EEPROMs are used to store the basic input-output system (BIOS) in personal computer systems. In the event this information is corrupted, the personal computer can malfunction. As another example, EEPROMs are also being employed as elements in mass storage elements devices, such as "solid state" disks. In the event an EEPROM within such a device fails, data errors will occur. There are reliability issues particular to EEPROMs, as well. The performance of EEPROM memory cells may degrade each time the memory cell is cycled through a program and erase operation. The reliability of an EPROM or EEPROM is thus often referred to in terms of "cycles."

Because many EPROMs and EEPROMs include sense amplifiers which sense current signals, defects resulting in the excess drawing of current can be a particularly problematic yield and/or reliability issue. Referring now to FIG. 1a, a schematic diagrams is set forth illustrating the sense operation of a defect free EPROM or EEPROM. FIG. 1b illustrates the sense operation of an EPROM or EEPROM that includes a current drawing defect.

Referring now to FIG. 1a, a portion of an EEPROM memory array 100 is set forth in a schematic diagram. Two memory cells of the array 100 are shown as Q100 and Q102. The memory cells (Q100 and Q102) each include a source, drain, floating gate, and control gate. The sources of the memory cells (Q100 and Q102) are commonly coupled to a low power supply, VSS, and the drains are commonly coupled to a bit line 102. The gates of the memory cells (Q100 and Q102) are coupled to different word lines, 104 and 106. The bit line 102 is coupled as one input to a current sense amplifier 108 by column select transistor N100. Transistor N100 is activated by a COLDEC signal applied to its gate. The other input to the sense amplifier 108 is a reference current, shown as Iref.

In the particular example of FIG. 1a, it is assumed that word line 104 is activated, and the word line 106 is de-activated. In addition, the column decode signal COLDEC is high, turning on transistor N100. As a result, data is read from memory cell Q100, and a current Isense, will be drawn through memory cell Q100. In the event memory cell Q100 is programmed (i.e., its floating gate is charged with negative charge), its threshold voltage will be high, and the Isense current will be negligible. Because word line 106 is de-activated, memory cell Q102 will be off, and also draw only a negligible current. The reference current Iref is designed to be greater than the sum of all such negligible currents, but less than the magnitude of the current drawn by an erase cell. Thus, because the Isense current is less than the Iref current, the output (SAOUT) of the current sense amplifier 108 will be low. In contrast, in the event memory cell Q100 is erased, when word line 104 is activated, Isense will be substantially higher than the Iref current, and SAOUT will be high.

FIG. 1b illustrates the same general EEPROM configuration as FIG. 1a, but differs from the previously described case, in that memory cell Q102 includes a defect. The defect results in current being drawn through the memory cell Q102, despite the fact that the memory cell is turned off. Thus, when word line 104 is activated, and transistor N100 is turned on, in addition to the current Isense being drawn by memory cell Q100, a defect induced leakage current (Ileak) will be drawn through memory cell Q102. Thus, the total current drawn on the bit line 102 will be Isense+Ileak.

In the event memory cell Q100 is programmed, Isense will be negligible, as in the case of FIG. 1a. However, the Ileak current will continue to be drawn. This can result in a slower sensing speed, as the current sense amplifier 108 may take longer to sense the smaller differential current produced by the difference between Iref and Ileak. Further, in the event the Ileak is greater than Iref, the sense amplifier 108 will output an erroneous high SAOUT signal.

Referring now to FIGS. 2a–2d, a series of side cross sectional views of memory cells is set forth to further illustrate current induced defects in an EEPROM. Each of the side cross sectional views of FIGS. 2a–2d sets forth a stacked gate "one-transistor" EEPROM cell, and so includes the same general structures. The memory cells are formed on a substrate 200, which includes a source 202, a drain 204, and a channel 206. A floating gate 208 is disposed above the channel 206, and a control gate 210 is disposed above the floating gate 208. A bit line 212 is shown coupled to the drain 204.

FIG. 2a illustrates a programmed memory cell that is accessed during a read operation. Negative charge is stored within the floating gate 208, resulting in a higher threshold voltage in the memory cell. Thus, when a positive potential is applied to the control gate 210, the potential will not be sufficient to invert the channel 206, and thereby create a conductive channel between the source 202 and drain 204. Consequently, only a negligible source-drain current (Isense) will be drawn through the bit line 212.

FIG. 2b illustrates an erased memory cell that is accessed during a read operation. The charge on the floating gate 208 results in the memory cell having a threshold voltage that is less than the positive potential applied to the control gate 210. The channel 206 inverts, and a conductive channel is formed between the source 202 and drain 204. Consequently, a relatively high source-drain current (Isense) will be drawn through the bit line 212.

FIG. 2c illustrates a defective memory cell that is not accessed during a read operation, but nevertheless draws current through the bit line 212. In the case of FIG. 2c, the floating gate 208 has accumulated a positive charge that results in the memory device functioning as a depletion mode device (i.e., a "depleted" bit). Despite the fact that the control gate 210 is maintained at a de-select voltage (zero volts as one example), the positive charge in the floating gate induces a conductive channel between the source 202 and drain 204. Consequently, a defect induced leakage current (Ileak) is drawn through bit line 212. Depleted bits can be cycling induced defects. That is, the positive charge may slowly accumulated over repeated cycling of the memory cell. In addition, depleted bits can be created by "over-erase." Over-erase occurs when an erase cycle removes too much negative charge from a floating gate, and the resulting floating gate has a relatively positive charge.

FIG. 2d illustrates a second example of a defective memory cell that is not accessed during a read operation. In the case of FIG. 2d, a process-induced defect has resulted in drain-substrate short condition. Thus, as in the case of FIG. 2c, a defect induced leakage current Ileak is drawn through bit line 212. In addition to drain-substrate shorts, other possible leakage paths include drain to source shorts (pipeline defects) and isolation leakage.

Depleted bits can be restored by a variety of processes that are referred to as "compaction," "healing," or "convergence." Such processes can inject additional electrons into the floating gate to reduce the positive charge thereon. A drawback to such approaches is that they can consume considerable time and/or require additional circuitry. Of course, compaction procedures, and variations thereof, are not effective in addressing bits having short-circuit like conditions, such as that set forth in FIG. 2d.

It would be desirable to provide an EPROM or EEPROM that can address the adverse effects of resulting from memory cells that introduce leakage current when data is being sensed in the memory cells.

SUMMARY OF THE INVENTION

According to the preferred embodiment, a leakage tolerant current sense amplifier is provided. The sense amplifier, prior to the sensing of data on a bit line, utilizes the sum of the reference current and an leakage current to establish a sense reference level. In the subsequent sense operation the sense reference level is compared with a read level. The read level is established by the sum of a sense current and any leakage current.

According to one aspect of an embodiment, a leakage tolerant sense amplifier includes a read node and a reference node coupled by a shorting device. In a sense operation, the read and reference nodes are shorted together, and a reference current and a leakage current establish a reference voltage at the shorted nodes. The read node and reference node are subsequently isolated from one another, and a signal current and the leakage current are used to establish a read voltage at the read node. The resulting difference in potential between the read node and the reference node establishes a logic output signal.

According to another aspect of an embodiment, a leakage tolerant sense amplifier includes a sense circuit that initially precharges a bit line and a reference line at the start of a sense cycle.

According to another aspect of an embodiment, a leakage tolerant sense amplifier has a cascode configuration that includes a load device in series with a bias device, coupled to a sense line. The bias level of the bias device is initially established by the potential of the sense line.

An advantage of the present invention is that it provides an EEPROM that can sense EEPROM cells on bit lines having defective cells which result in excessive amounts of current being drawn.

DETAILED DESCRIPTION OF THE EMBODIMENTS

Figure 1A:
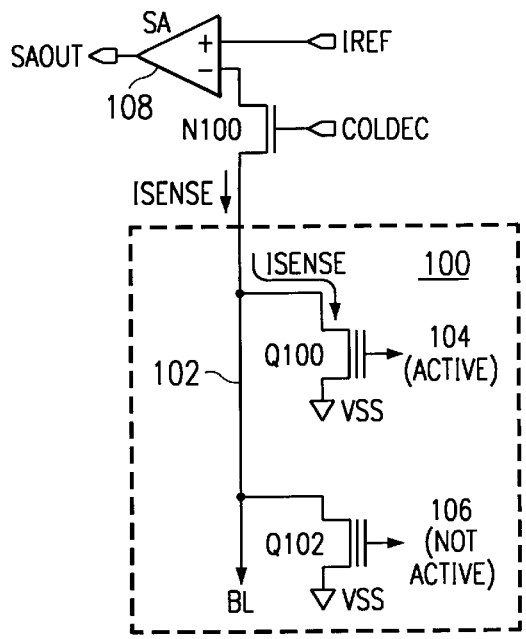
FIGS. 1a–1b are schematic diagrams illustrating the operation of a prior art EEPROM having a defect free memory array, and a memory array having a memory cell with a current drawing defect.
Figure 1B:
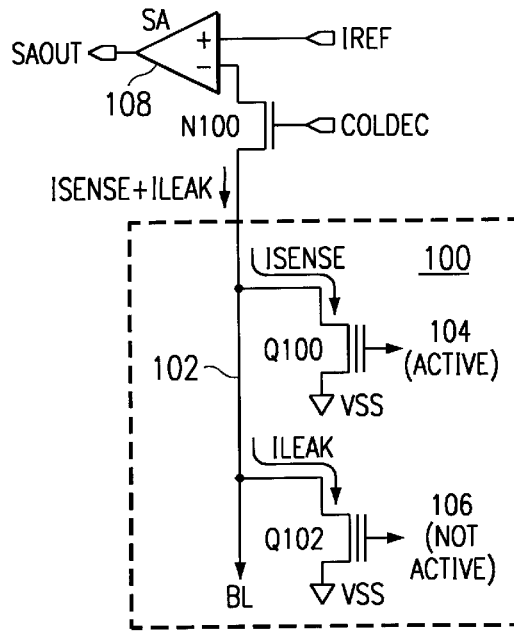
Figure 2A:
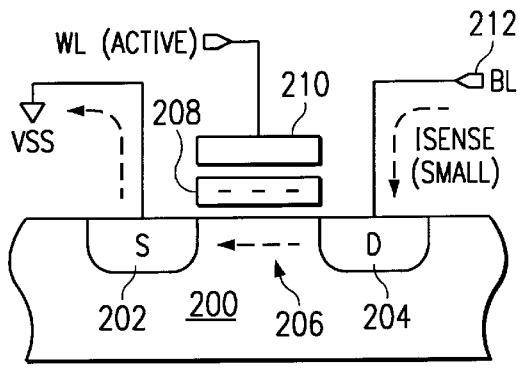
FIGS. 2a–2d are side cross sectional views illustrating the operation of a defect free EEPROM cell, and EEPROM cells having current drawing defects.
Figure 2B:
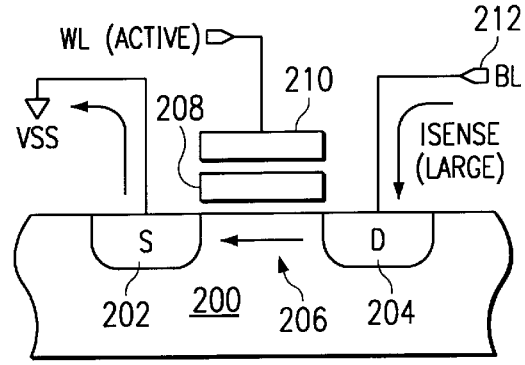
Figure 2C:
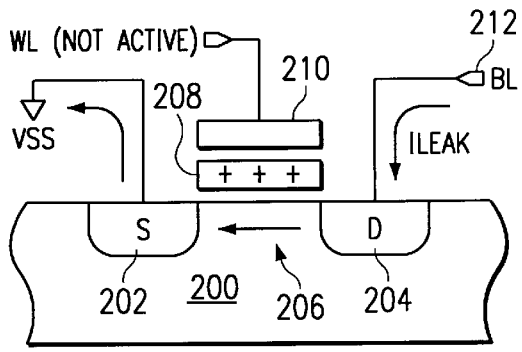
Figure 2D:
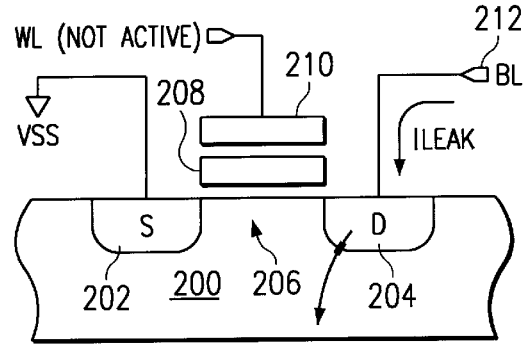

The preferred embodiment is a sense amplifier arrangement that may be used in an electrically erasable and programmable read only memory (EEPROM). The preferred embodiment can be considered a "leakage tolerant" sensing arrangement, in that data current signals can be detected despite the presence of leakage current. The preferred embodiment is set forth in a general block schematic diagram in FIGS. 3a and 3b, and designated by the general reference character 300.

Figure 3A:
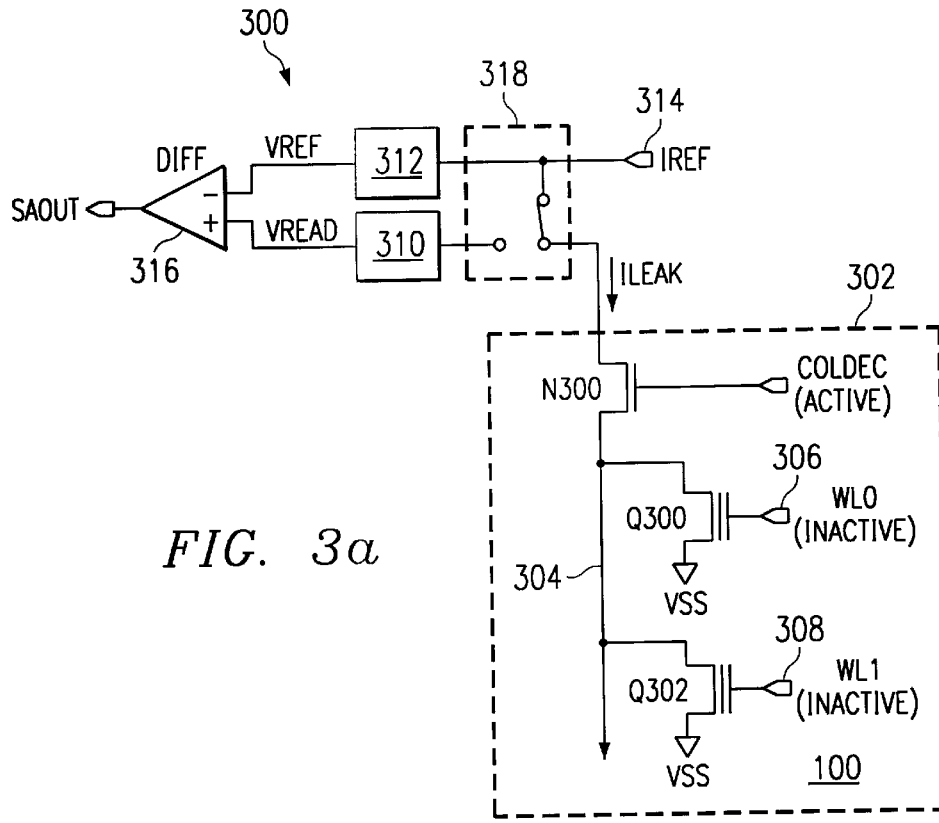
FIGS. 3a and 3b are block schematic diagrams illustrating the general operation of a first embodiment.
Figure 3B:
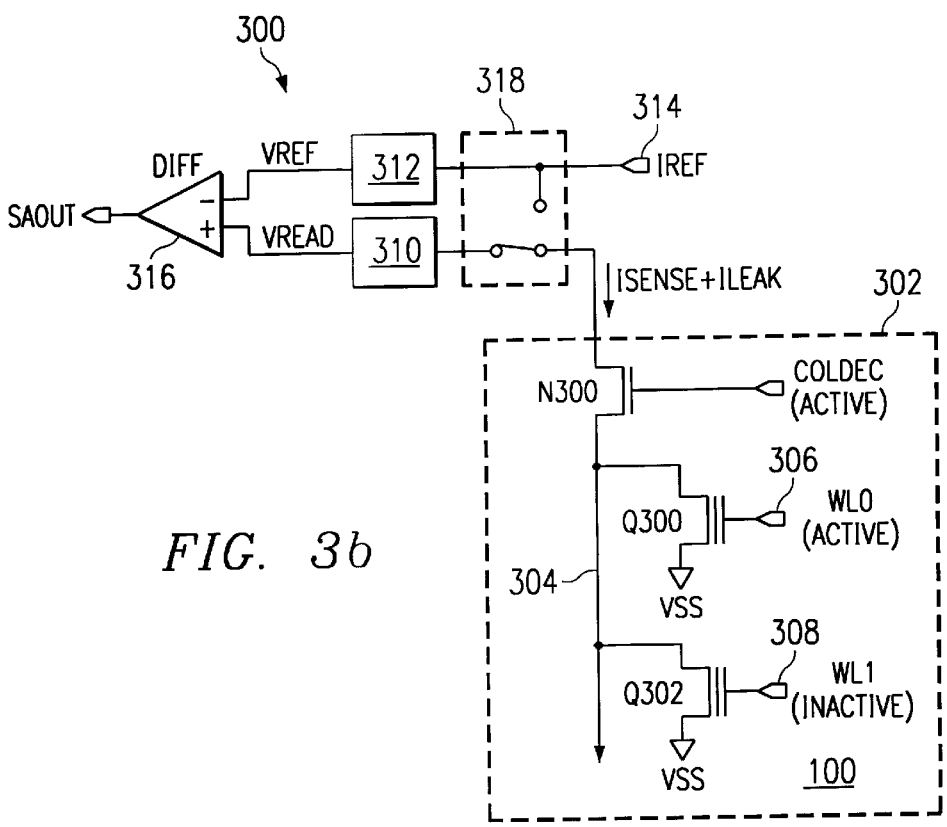

The preferred embodiment 300 is shown to include a memory array 302, having a number of EEPROM memory cells arranged in rows and columns. In FIGS. 3a and 3b two memory cells are set forth, Q300 and Q302. In the preferred embodiment 300, the memory cells are one-transistor "stacked" EEPROM memory cells. The memory cells (Q300 and Q302) are accessed by the activation of word lines, which results in current signals on bit lines. In FIGS. 3a and 3b, one bit line 304 and two word lines (306 and 308) are illustrated. The bit line 304 is commonly coupled to the drains of memory cells Q300 and Q302. Word lines 306 and 308 are coupled to the gates of memory cells Q300 and Q302, respectively. The sources of the memory cells (Q300 and Q302) are commonly coupled to a low power supply voltage VSS. While the sources of the memory cells are shown coupled to VSS, this connection may be by way of a source decoding circuitry. Such arrangements are common in sector, or page divided "flash" EEPROM architectures. The array 302 is further shown to include an n-channel metal-oxide-semiconductor (MOS) column decode transistor N300. Transistor N300 is activated by a column decode signal COLDEC.

The bit line 304 of the array 302 is coupled to a first load circuit 310 by transistor N300. In response to current flowing through the bit line 304, the first load circuit 310 provides a read voltage Vread. In a similar fashion, a second load circuit 312 receives a reference current on reference line 314, to generate a reference voltage Vref. The Vref voltage is provided as a plus input (+) to a differential amplifier 316. The Vread voltage is provided as a minus (−) input to the differential amplifier 316. In addition, the preferred embodiment 300 also includes a switching device 318 that can couple the reference line 314 to the bit line 304, or alternatively, isolate the reference line 314 from the bit line 304.

FIG. 3a illustrates a reference portion of a sense operation. The reference portion of the sense operation occurs before a word line (306 and 308) is activated in response to an applied address. In the particular example of FIG. 3a, it is assumed that memory cell Q302 includes a current inducing defect, and the COLDEC signal is active, turning on transistor N300. As a result, even though word line 308 is not activated, some leakage current Ileak, will be drawn through the bit line 304. At the same time, a reference current Iref, is flowing through the reference line 314. In the reference portion of the sense operation, the switching device 318 couples the reference line 314 to the bit line 304. As a result, the second load circuit 312 receives the sum of the Ileak current and the Iref currents. Thus, in the preferred embodiment 300, the Vref voltage is based upon the sum of the Ileak and Iref currents, as opposed to only the Iref current.

FIG. 3b represents a sense portion of a sense operation. The sense portion occurs when a word line is activated, and memory cell data is placed on the bit line in the form of a current signal. In the embodiment of FIG. 3b, it is assumed that an applied address results in the selection of memory cell Q300. Word line 306 and the COLDEC signal are both active, and memory cell Q300 will draw a current, Isense, through the bit line 304. At the same time, transistor Q302 will continue to draw the Ileak current through the bit line 304. In the sense portion of the sense operation, the switching device 318 isolates the reference line 314 from the bit line 304. As a result, the first load circuit 310 receives the sum of the Ileak current and the Isense currents. Thus, in the preferred embodiment 300, the Vread voltage is based upon the sum of the Ileak and Isense currents, as opposed to only the Isense current. The differential amplifier 316 will then provide an output signal based upon the comparison of the Vref signal (based on Iref+Ileak) and the Vread signal (based on Isense+Ileak), offsetting the adverse effects to the leakage current Ileak.

Figure 4:
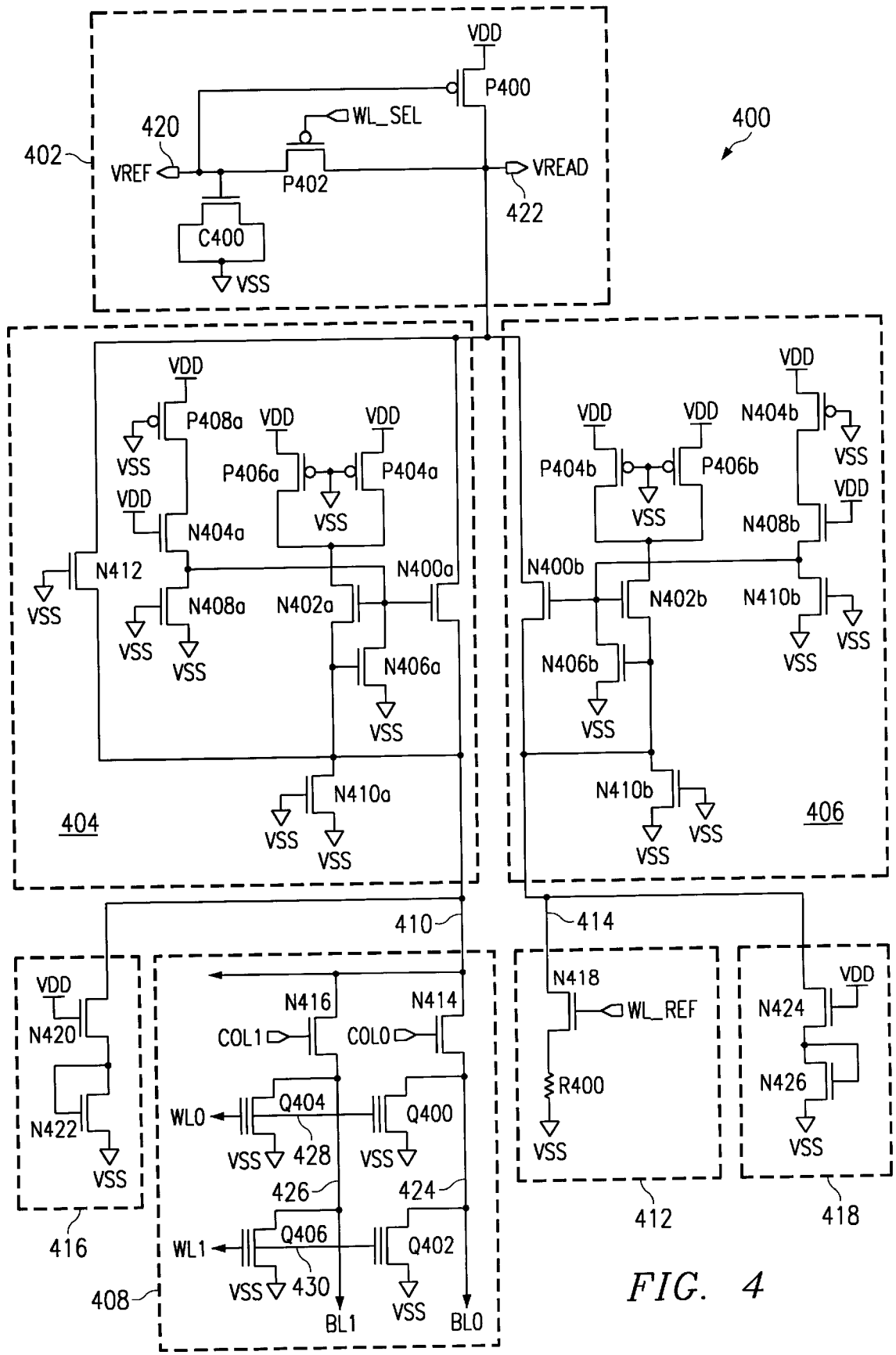
FIG. 4 is a schematic diagram of a first embodiment.

A detailed schematic diagram of a first embodiment is set forth in FIG. 4. The first embodiment is designated by the general reference character 400, and is shown to include a load stage 402, a first bias stage 404, and a second bias stage 406. A sense current (Isense), is generated by an array 408, and provided to the first bias stage 404 by a sense line 410. In a similar fashion, a reference current (Iref), is generated by a reference circuit 412, and provided to the second bias stage 406 by a reference line 414. In addition, a first leaker circuit 416 is coupled to the sense line 410, and a second leaker circuit 418 is coupled to the reference line 414.

The load stage 402 includes a p-channel MOS load transistor P400, having a source coupled to a high power supply voltage VDD, a gate coupled to a reference node 420, and a drain coupled to a read node 422. The read node 422 is coupled to the reference node 420 by the source-drain path of a p-channel MOS switch transistor P402. The gate of transistor P402 receives a word line select signal WL_SEL. A capacitor, C400, is coupled between the reference node 420 and the low power supply voltage VSS. In operation, the load stage 402 provides output voltages at the read node 422 reference node 420 in response to current signals on the sense line 410 and reference line 414. Thus, while the general block diagram of FIGS. 3a and 3b sets forth a first load circuit 310 and second load circuit 312, these structures are essentially merged into a single load stage 402 in the first embodiment 400.

The read node 422 is common to both the first bias stage 404 and the second bias stage 406. The first bias stage 404 (in conjunction with the second bias stage 406) provides a voltage at the read node 422 that represents the magnitude of the current being drawn through the sense line 410. The first bias stage 404 is shown to include n-channel MOS bias transistor N400a, having a source-drain path between the sense line 410 and the read node 422. A bias voltage is applied to the gate of transistor N400a by the remainder of the first bias stage 404. The remainder of the first bias stage 404 includes transistor N402a, which has a source-drain path coupled between p-channel MOS current source transistors P404a and P406a and the sense line 410. Transistors P404a and P406a have their sources commonly coupled to the VDD power supply, their gates coupled to the VSS power supply, and their drains coupled to the drain of transistor N402a.

The common gates of transistors N402a and N400a are biased by a p-channel MOS transistor P408a in series with an n-channel MOS transistor N404a. Transistor P408a has its source coupled to the VDD power supply, its gate coupled to the VSS power supply, and its drain coupled to the drain of transistor N404a. Transistor N404a has its gate coupled to the VDD power supply, and its source coupled to the common gates of transistors N400a and N402a. In addition, an n-channel MOS transistor N408a includes a drain coupled to the source of transistor N404a, and a gate and source coupled to the VSS power supply.

The common gates of transistors N402a and N400a are further biased by an n-channel MOS transistor N406a, having a source-drain path coupled to the VSS power supply, and a gate coupled to the source of transistor of transistor N402a.

Transistor N408a prevents the common gates of transistors N400a and N402a from falling more than one threshold voltage below the VSS power supply voltage. Transistor N410a performs the same function for the sense line 410.

In the particular embodiment of FIG. 4, the second bias stage 406 has a similar configuration to the first bias stage 404. An n-channel MOS bias transistor N400b has a source-drain path coupled between the read node 422 and the reference line 414. Transistor N400b essentially mirrors transistor N400a. The remainder of the devices making up the second bias stage 406 also mirror devices in the first bias stage 404. To that extent, devices in the second bias stage 406 will have the same reference number, but end with the letter "b" instead of the letter "a." The second bias stage 406 serves to establish a voltage at the read node 422 representative of the current being drawn through the reference line 414.

As shown in FIG. 4, the first bias stage 404 further includes a third n-channel MOS clamping transistor N412, having a drain coupled to the read node 422, a source coupled to the sense line 410, and a gate coupled to the VSS power supply.

The array 408 provides a data signal according to an applied memory address. When an address is applied, a particular memory cell from within the array 408 is selected. Depending upon whether the memory cell is erased or programmed, the memory cell will draw a substantial amount of current in the sense line 410, or a relatively negligible current. In addition, the sense line 410 will also draw a leakage current in the event defective cells are present.

The array 408 is show to include a number of bit lines and word lines coupled to EEPROM cells arranged in a matrix. In FIG. 4, four memory cells are shown as Q400, Q402, Q404 and Q406. In the particular embodiment of FIG. 4, the memory cells (Q400–Q406) are one transistor stacked gate EEPROM memory cells, each having a source, drain, floating gate, and control gate. The sources of the memory cells (Q400–Q406) are commonly coupled to the power supply VSS. As in the case of FIGS. 3a and 3b, the sources may be decoded. Memory cells Q400 and Q402 are within the same column, and have drains coupled to a first bit line 424. In a similar fashion, memory cells Q404 and Q406 are within another column, and have drains coupled to a second bit line 426. Memory cells Q404 and Q400 are within the same row, and have control gates commonly coupled to a first word line 428. Memory cells Q406 and Q402 are within another row, and have control gates coupled to a second word line 430.

The first bit line 424 is coupled to the sense line 410 by an n-channel MOS column select transistor N414. The second bit line 426 is coupled to the sense line 410 by another n-channel MOS column select transistor N416. Transistor N414 and N416 thus make up a column decoding circuit.

The reference circuit 412 provides a reference current that can be compared with the current drawn by a memory cell, and thereby determine the logic stored by the memory cell. As noted above, in the particular embodiment of FIG. 4, the reference current (in addition to any leakage current) will be used to generate a reference voltage, VREF. This voltage is compared with a read voltage VREAD. The read voltage is generated in response to a memory cell current (in addition to any leakage current).

The reference circuit 412 set forth utilizes a resistor R400 coupled between the source of an n-channel MOS reference select transistor N418, and the VSS power supply. The source-drain path of transistor N418 couples the resistor R400 to the reference line 414. The gate of transistor N418 is driven by a WL_REF signal. Thus, when the WL_REF signal goes high, a current, dependent upon the value of R400 will be drawn in the reference line 414. Instead of using a resistor R400, it is possible to use a FAMOS reference alterred by a sense ratio as a reference.

While the particular embodiment of FIG. 4 generates a reference current with a select transistor in series with a resistor, other types of reference circuits could be employed. As just one example, the reference circuit could include a "dummy" memory cell arranged between the sense line 414 and the VSS power supply, either alone, or in series with a select transistor.

The first leaker circuit 416 includes the series connection of two n-channel MOS transistors, N420 and N422. Transistor N420 has a drain coupled to the sense line 410, a gate coupled to the VDD power supply voltage, and a source coupled to the drain of transistor N422. Transistor N422 has a "diode" configuration with its gate being coupled to its drain. The source of transistor N422 is coupled to the VSS power supply.

The second leaker circuit 418 has the same general configuration as the first leaker circuit 416, including the series connection of two n-channel MOS transistors, N424 and N426.

An alternate way of conceptualizing the first embodiment of FIG. 3 is to consider the circuit as two parallel cascode configurations, sharing a load device. The first cascode would be a sense cascode, including transistor P400 functioning as a load device, and transistor N400a functioning as a bias device. An accessed memory cell in combination with the column select transistors N414 and N416, could be considered the cascode input device. The second cascode is a reference cascode, and includes the same load device, transistor P400. Transistor N400b functions as a bias device, and transistor N418 in combination with resistor R400 functions as an input device.

The reference cascode and sense cascode operate in parallel to establish a reference voltage at the reference node 420 during reference portion of a sense cycle. The reference cascode is responsive to a reference current, the sense cascode is responsive to any leakage current. In a subsequent sense portion of the sense cycle, the reference cascode is responsive to a negligible current (as the reference circuit 412 is disabled), while the sense cascode is responsive to current drawn by an accessed memory cell, in addition to any leakage current.

Figure 5:
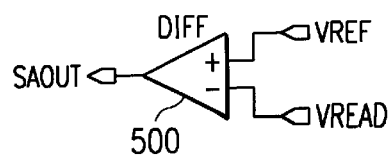
FIG. 5 is a block diagram illustrating the connection of the circuit in FIG. 4 to a differential amplifier.

Referring now to FIG. 5, the first embodiment is shown to further include a differential amplifier 500 having a minus (−) input coupled to the read node 422, and a plus input (+) coupled to the reference node 420. When the potential at the read node 422 rises above that of the reference node 420, the output (SAOUT) of the differential amplifier 500 will be driven to a low level (the VSS supply voltage). When the potential at the read node 422 falls below that of the reference-node 420, the output (SAOUT) of the differential amplifier 500 will be driven to a high level (the VDD supply voltage).

Figure 6:
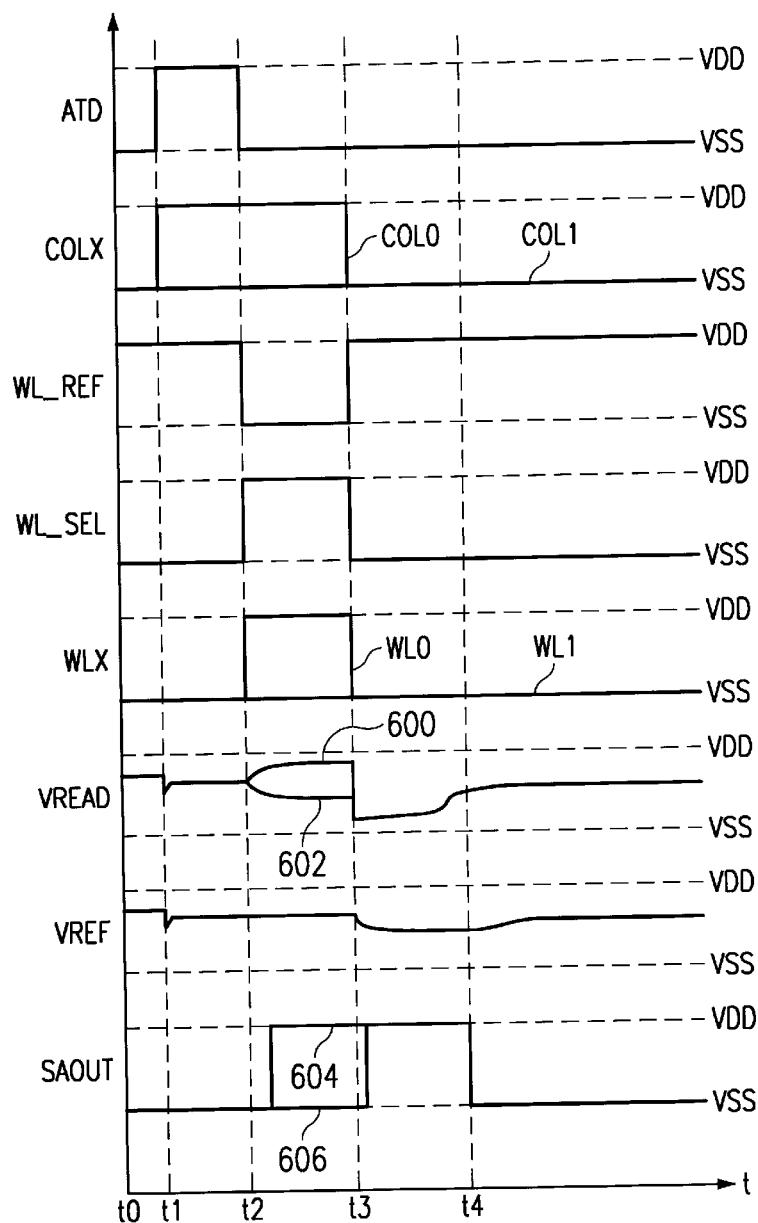
FIG. 6 is a timing diagram illustrating the operation of the first embodiment set forth in FIGS. 4 and 5.

Referring now to FIG. 6, a timing diagram is set forth illustrating the operation of the first embodiment set forth in FIGS. 4 and 5. A number of waveforms are illustrated. The ATD waveform is an "address transition detect" signal. The ATD signal is a high going pulse, generated by a change in address. The EEPROM of the first embodiment in FIG. 4 is an asynchronous EEPROM. As such, memory access cycles are initiated by a change in an address. Of course, in the case of a synchronous device, a memory access cycle would be initiated by a synchronous clock signal. The COLX waveforms represent column select operations. In a memory access cycle, one bit line (or a set of bit lines) in an array will be selected, while the remaining bit lines of the array will be de-selected. Referring back to FIG. 4, for the purposes of this discussion, it is assumed that memory cell Q400 is accessed in a read operation. Thus, the COLX waveforms illustrates a high going COL0 signal, used to select the first bit line 424, and a low staying COL1 signal, used to maintain the second bit line 426 in a de-selected state.

The WL_REF signal represents a signal that enables the reference circuit 412 by turning on transistor N418, to generate a reference current in the reference line 414. The WL_SEL waveform goes high in conjunction with the selection of a word line in the array 408. In the particular embodiment of FIGS. 4 and 5, the WL_SEL is the logical inverse of the WL_REF signal. The WLX signal illustrates the selection of a word line in the array, in response to the applied memory address. Because memory cell Q400 is selected in the example of FIG. 6, the signal WL0, which drives the first word line 428, will go high. In contrast, the signal WL1, which drives the second word line 430, will remain low throughout the illustrated memory access operation:

The VREAD signal illustrates the potential at the read node 422. Two responses are set forth, one for a programmed cell (shown as 600) and one for an erased cell (shown as 602). The VREF signal illustrates the potential at the reference node 420. The comparison between the VREAD and VREF signals determines the logic of a selected memory cell.

The SAOUT signal illustrates the output of the differential amplifier 500 shown in FIG. 5. Two responses are illustrated, one for an erased cell (shown as 604), and one for a programmed cell (shown as 606).

Selected points in time in a memory access operation are shown as t0–t4 in FIG. 6. At time t0, the EEPROM device is in a stand-by state, and awaiting a memory access operation. No transition in the address has occurred, so the ATD signal is low. The COL0 and COL1 signals are both low, signifying that all of the columns in the array 408 are de-selected. The bit lines (424 and 426) are thus isolated from the sense line 410.

While the COL0 and COL1 signals are low at time t0, the WL_REF signal is high. The WL_SEL signal, being the inverse of WL_REF, is thus low. All of the word line signals (WL0 and WL1) are also low. With WL_REF high, transistor N418 is turned on, coupling the reference line 414 to resistor R400. A reference current is thus drawn in the reference line 414. At the same time, with WL_SEL low, transistor P402 is turned on, and the reference node 420 is coupled to the read node 422. In this arrangement, with transistor P402 functioning as an active load (its gate tied to its drain), the capacitor C400 charges to a reference voltage. Thus, at time t0, the VREF and VREAD signals are biased to the same reference voltage, established by the reference current in reference line 414. It is assumed that prior to time t0, VREF was lower than VREAD, and so the signal SAOUT is low.

At time t1, an address transition occurs, and the ATD signal rises from the VSS to the VDD level. In response to the ATD signal and the applied address, memory cell Q400 is to be selected. Accordingly, the first bit line 424 is selected, and the second bit line 426 remains de-selected. Thus, at time t1, the COL0 signal goes high, and the COL1 signal remains at VSS, turning on transistor N414, and keeping transistor N418 in an off condition.

As shown in FIG. 6, the WL_REF signal remains high at time t1. Thus, a reference current continues to be drawn through the reference line 414. The WL_SEL, WL0 and WL1 signals remain low, as no word line is selected at this time.

The initial coupling of the first bit line 424 to the sense line 410 results in the read node 422 (and the reference node 420) dipping to a lower voltage. In addition, because the transistor N414 is on, any memory cells coupled to the first bit line 424 that have current drawing defects, will result in a leakage current being drawn in the sense line 410. The combination of the current drawn in the sense line 410 (any leakage current) and the current drawn in the reference line 412 (the reference current) results in adjusted reference voltage at the shorted read node 422 and reference node 420. The reference voltage is considered "adjusted" because it will reflect the combination of the leakage current and the reference current, as opposed to only the reference current. Thus, after the initial dip in potential, between times t1 and t2, the VREAD and VREF signals will rise the adjusted reference voltage. This voltage will be stored by capacitor C400.

Because there is no substantial variation between the VREF and VREAD signals, the SAOUT signal remains low at time t1.

At time t2, the initial ATD pulse falls from a high to low level. Also at time t2, the COL0 signal remains high, coupling the first bit line 424 to the sense line 410. The COL1 signal remains low, representing the de-selection of other columns in the array 408.

Also at time t2, the WL_REF signal transitions low, turning off transistor N418, isolating resistor R400 from the reference line 414. At the same time, the WL_SEL signal (which is the inverse of the WL_REF signal) goes high, indicating that a selected word line is driven high. The high WL_SEL signal results in transistor P402 being turned off, which isolates the reference node 420 from the read node 422. In this manner, the adjusted reference voltage is stored (by capacitor C400) at the reference node 420.

In the example of FIG. 6, the address that generates the ATD pulse, results in the WL0 signal transitioning to a high voltage at time t2. The WL1 signal remains low. When word line WL0 goes high, memory cell Q400 is accessed. In the event memory cell Q400 is programmed, a relatively high impedance path will exist between the first bit line 424 and the VSS power supply. In the event the memory cell Q400 is erased, a relatively low impedance path will exist between the first bit line 424 and the VSS power supply. Because transistor N414 is turned on, the accessing of memory cell Q400 will result in a current signal on the sense line 410. The current will be essentially negligible if the memory cell Q400 is programmed, or relatively high if the memory cell Q400 is erased. Further, any leakage current from memory cells coupled to the first bit line 424 will contribute to the current signal.

The current drawn on the sense line 410 results in a read voltage VREAD at the read node 422. The potential of the VREAD signal will depend upon whether memory cell Q400 is programmed or erased. It will be recalled that the reference current (and any leakage current from the first bit line 424) established the adjusted reference voltage at the gate of transistor P400. In the event transistor Q400 is programmed, the only current flowing through the sense line 410 will be any leakage current. As a result, less current will be drawn through the source-drain path of transistor P400 than that which was used to establish the adjusted reference voltage. With a smaller source-drain current, but the same gate source voltage, source-drain voltage of transistor P400 will fall, resulting in the VREAD voltage rising. In the event the transistor Q400 is erased, the amount of current introduced by the memory cell Q400 will be greater than the current used to establish the adjusted reference voltage. The source-drain voltage of transistor P400 will increase, resulting in the VREAD voltage dropping. Waveform 600 in FIG. 6 illustrates the resulting VREAD voltage for a programmed memory cell. Waveform 602 illustrates the resulting response of an erased memory cell.

The VREF waveform between times t2 and t3 illustrates the adjusted reference voltage isolated at the gate of transistor P400.

The SAOUT waveform illustrates the resulting data signal output of the differential amplifier 500 set forth in FIG. 5, in response to the VREAD and VREF waveforms. Waveform 604 illustrates the SAOUT signal response to an erased bit. Waveform 606 illustrates the SAOUT signal response to a programmed bit. In the case of waveform 606, because the VREAD signal (which is coupled to the minus input of the differential amplifier 500) is greater than the VREF signal (which is coupled to the plus input of the differential amplifier 500), the SAOUT signal will remain at a low level. Conversely, in the case of waveform 604, because the VREAD signal is less than the VREF signal, the SAOUT signal will transition to high level shortly after time t2.

At time t3, the columns are all de-selected, and the COL0 signal returns to the VSS voltage, turning off transistor N414. The array 408 is thus isolated once again from the sense line 410.

Also at t3, WL_REF signal returns to a high level, and the WL_SEL and WL0 signals return to a low level. Transistor P402 within the load stage 402 is turned on, and the read node 422 and reference node 420 are coupled together once again. Transistor N418 in the reference circuit 412 is turned on, and the reference current is drawn once again through the reference line 414.

When transistor N418 is turned on, the read node 422 is initially pulled low. The reference node 420 is also pulled low, but due to the charge on capacitor C400, the reference node 420 remains higher than the read node 422. In response, the SAOUT signal will remain high (in the event the previously read memory cell was erased), or transition high (in the event the previously read memory cell was programmed).

After this initial dip, transistor P400 in the load stage 402 will begin to pull both the read node 422, and the reference node 420 by way of transistor P402, to the reference voltage.

Figure 8:
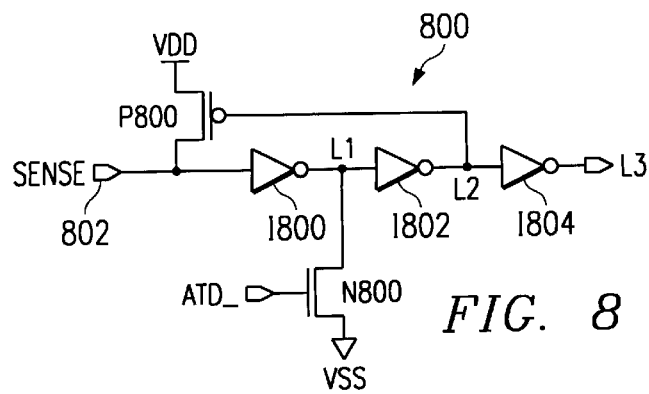
FIG. 8 is a timing circuit of the second embodiment.
Figure 7:
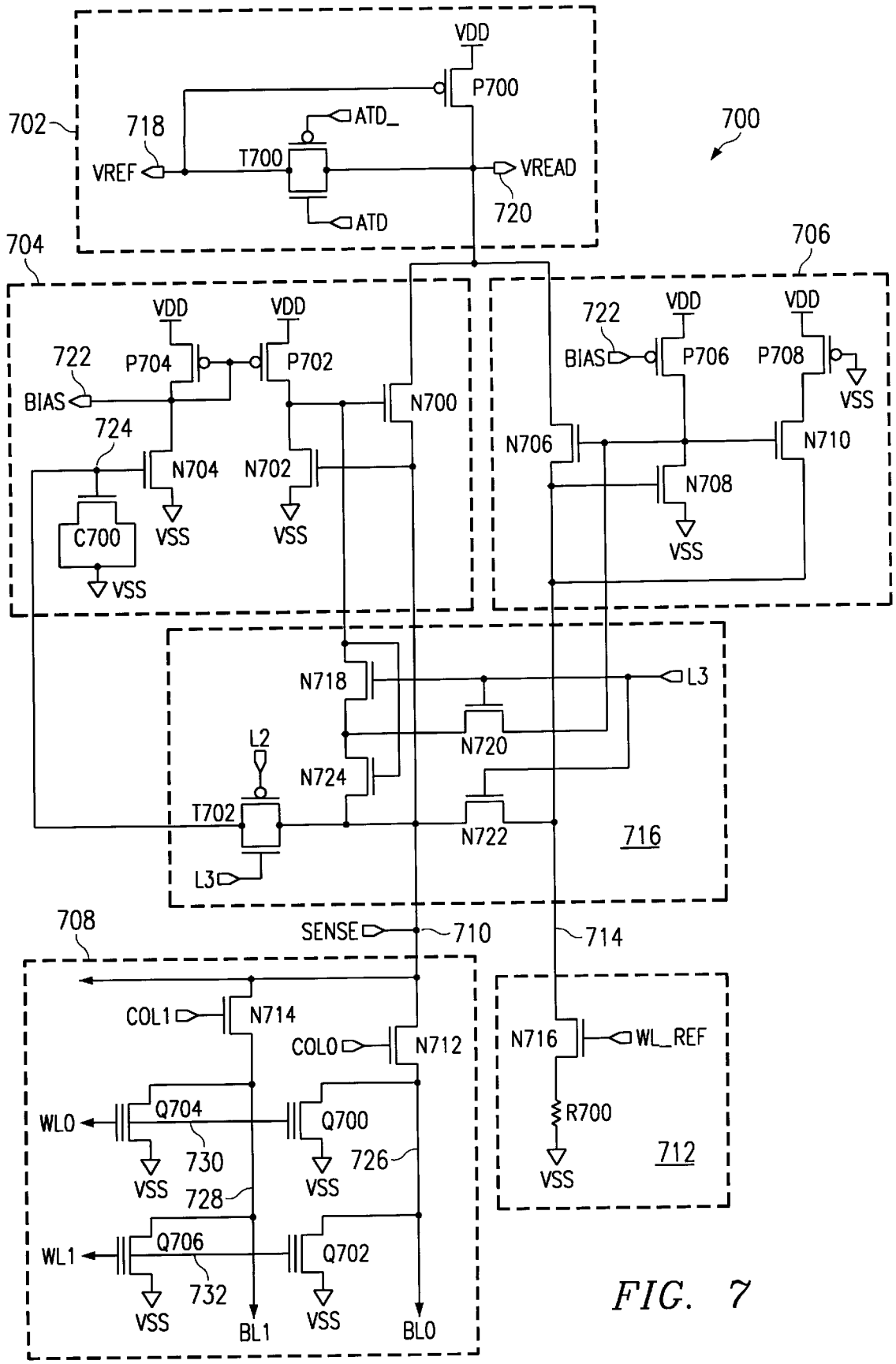
FIG. 7 is a schematic diagram of a second embodiment.

A second embodiment is set forth in FIGS. 7 and 8. FIG. 7 is a schematic diagram of the second embodiment. The second embodiment is similar to the first embodiment 400, in that it provides a reference voltage, VREF, for comparison with a read voltage, VREAD. These two voltages may be compared in a differential amplifier, such as that set forth in FIG. 5. The second embodiment further includes a charge circuit, set forth in a schematic diagram in FIG. 8.

Referring now to FIG. 7, the second embodiment is designated by the general reference character 700, and shown to include a load stage 702, a first bias circuit 704, a second bias circuit 706. A memory array 708 is coupled to the first bias circuit 704 by a sense line 710. A reference circuit 712 is coupled to the second bias circuit 706 by a reference line 714. In addition, the second embodiment 700 further includes a line charge circuit 716.

The load stage 702 of the second embodiment 700 is shown to include a p-channel MOS load transistor P700, having a source coupled to a high power supply voltage VDD, a gate coupled to a reference node 718, and a drain coupled to a read node 720. The read node 720 is coupled to the reference node 718 by a complementary MOS (CMOS) passgate T700. As in the case of the first embodiment 400, the load stage 702 of the second embodiment 700 provides output voltages at the read node 720 and reference node 718 in response to current signals on the sense line 710 and reference line 714.

The first bias stage 704 and the second bias stage 706 are coupled to the read node 720. The first bias stage 704 is shown to include an n-channel MOS transistor N700 having a source-drain path disposed between the read node 720 and the sense line 710. The first bias stage further includes a current mirror formed by two p-channel MOS transistors, P702 and P704. The sources of transistors P702 and P704 are coupled to the VDD power supply, and their gates are coupled to one another, and to the drain of transistor P704. The drain of transistor P702 forms a first leg of the current mirror, and is coupled to the gate of transistor N700. The drain of transistor P704 forms a second leg of the current mirror. The commonly connected gates of transistors P702 and P704 form a bias node 722.

The first bias stage 704 further includes two n-channel MOS transistors N702 and N704 coupled in series with the legs of the current mirror. Transistor N702 has a source-drain path disposed between the drain of transistor P702 and the VSS power supply. The gate of transistor N702 is coupled to the sense line 710. Transistor N704 has a source-drain path disposed between the drain of transistor P704 and the VSS power supply, and has a gate coupled to a store node 724. A capacitor C700 is coupled between the store node 724 and the VSS power supply.

The second bias stage 706 has a similar arrangement to the first bias stage 704. An n-channel MOS transistor N706 has a source-drain path coupled between the read node 720 and the reference line 714. The gate of transistor N706 is coupled to a bias stage formed by a p-channel MOS transistor P706 arranged in series with an n-channel MOS transistor N708. Transistor P706 has a source coupled to the VDD power supply, a drain coupled to the gate of transistor N706, and a gate coupled to the bias node 722. Thus, the drain voltage of transistor P706 will track that of transistors P702 and P704 in the first bias stage 704. The source-drain path of transistor N708 is coupled between the drain of transistor P706 and the VSS power supply. The gate of transistor N708 is coupled to the reference line 714. The second bias circuit 706 further includes an n-channel MOS transistor N710 having a source coupled to the reference line 714 and a gate coupled to the gate of transistor N706. The drain of transistor N710 is coupled to the VDD power supply by a p-channel transistor P708. The gate of transistor P708 is coupled to the VSS power supply.

The array 708 of the second embodiment has the same general configuration as that of the first embodiment 400. A memory cell is selected, resulting in a current signal on the sense line 710. The array 708 set forth includes four memory cells (Q700, Q702, Q704 and Q706) arranged in a matrix. The sources of the memory cells (Q700–Q706) are commonly coupled to the power supply VSS (and may be decoded). Memory cells Q700 and Q702 have drains coupled to a first bit line 726. Memory cells Q704 and Q706 have drains coupled to a second bit line 728. A first word line 730 drives the control gates of memory cells Q700 and Q704. A second word line 732 drives the control gates of memory cells Q706 and Q702. N-channel MOS column passgate transistors N712 and N714 couple the first and second bit lines (726 and 728), respectively, to the sense line 710.

The reference circuit 712 of the second embodiment 700 has the same general configuration as that in the first embodiment 400. The reference circuit 712 includes a resistor R700 that is coupled to the reference line 714 by an n-channel MOS reference select transistor N716. The gate of transistor N716 is driven by a WL_REF signal. The same sort of possible variations in the implementation of the reference circuit in the first embodiment 400 can also be applicable to the reference circuit 712 of the second embodiment 700.

Unlike the first embodiment 400, the second embodiment 700 includes a line charge circuit 716. The line charge circuit 716 includes a CMOS passgate T702 coupled between the store node 724 and the sense line 710. The gate of the p-channel device of the passgate T702 receives a signal shown as L2. The gate of the n-channel device of the passgate T702 receives a signal shown as L3. The generation of the L2 and L3 signals will be discussed in conjunction with FIG. 8.

The line charge circuit 716 also includes n-channel MOS bias equalizing transistors N718 and N720. The source drain paths of transistors N718 and N720 are coupled between the gates of bias transistors N700 and N706 in the first and second bias stages (704 and 706). Transistor N718 has a drain coupled to the gate of transistor N700, the source of transistor N718 is coupled to the source of transistor N720. The source-drain path of transistor N720 is coupled between the source of transistor N718 and the gate of transistor N706. The gates of transistors N718 and N720 are commonly driven by the L2 signal. Thus, when enabled, transistor N718 and N720 provide a low impedance path between the gates of transistors N700 and N706, equalizing the potentials thereon.

The line charge circuit 716 further includes a line equalization transistor N722, and a load transistor N724. Transistor N724 has a drain coupled to the source of transistor N718, a gate coupled to the drain of transistor N718, and source coupled to the sense line 710. Transistor N722 has a source-drain path coupled between the sense line 710 and the reference line 714. The gate of transistor N722 is also driven by the L3 signal. Thus, when the L3 signal is high, the reference line 714 is coupled to the sense line 710, and transistor N724 has a "diode" configuration between the common reference and sense lines (710 and 714), and the gates of transistors N700 and N706, which are coupled together by the activation of transistors N718 and N720.

As in the case of the first embodiment if FIG. 3, the second embodiment of FIG. 7 can also be conceptualized as parallel cascode elements which share a common load device. The load device would be transistor P700. A sense cascode would include load device (transistor P700), and a bias device (transistor N700), and an input device (the memory array 708). Similarly, a reference cascode would include the load device (transistor P700), a bias device (transistor N706), and an input device (the reference circuit 712).

Referring now to FIG. 8, a timing circuit of the second embodiment is set forth in FIG. 8. The timing circuit is designated by the general reference character 800, and shown to include an input node 802. The input node 802 is coupled to the sense line 710. The input node 802 is provided as an input to a chain of three inverters, shown as I800, I802 and I804. The output of inverter I800 is coupled to the VSS power supply by the source-drain path of an n-channel MOS pull-down transistor N800. The gate of transistor N800 is driven by the inverse of an ATD signal, shown as ATD__. The output of inverter I802 is the L2 signal. The output of inverter I804 is the L3 signal. A p-channel MOS pull-up transistor P800 has a source-drain path coupled between the input node 802 and the VDD power supply. The gate of transistor P800 is driven by the L2 signal.

The timing circuit 800 will initially charge the sense line 710 (and reference line 714) to a initial charge potential based upon the potential of the sense line 710. When the ATD__ signal is high, the timing circuit 800 is disabled, with the L2 signal being forced high, and the L3 signal being forced low. When the ATD__signal is high, however, a drop in the sense line 710 potential will result in the L2 signal being low and the L3 signal being high.

After inverter delays, transistor P800 will begin pulling the sense line 710 to a higher potential. The signals L2 and L3 will then return to high and low potentials. This action "traps" the pulled-up sense line 710 voltage in the store node 724. Thus, unlike the first embodiment of FIG. 3, in the second embodiment of FIG. 7 the bias devices (N700 and N706) are biased to an initial value based upon the potential on the bit lines. Following this initial bias operation, the sense cycle proceeds in a similar fashion as the first embodiment. A reference voltage is established based upon a reference current and any leakage current, and the subsequently compared with a read voltage, based upon a sense current and any leakage current.

Figure 9:
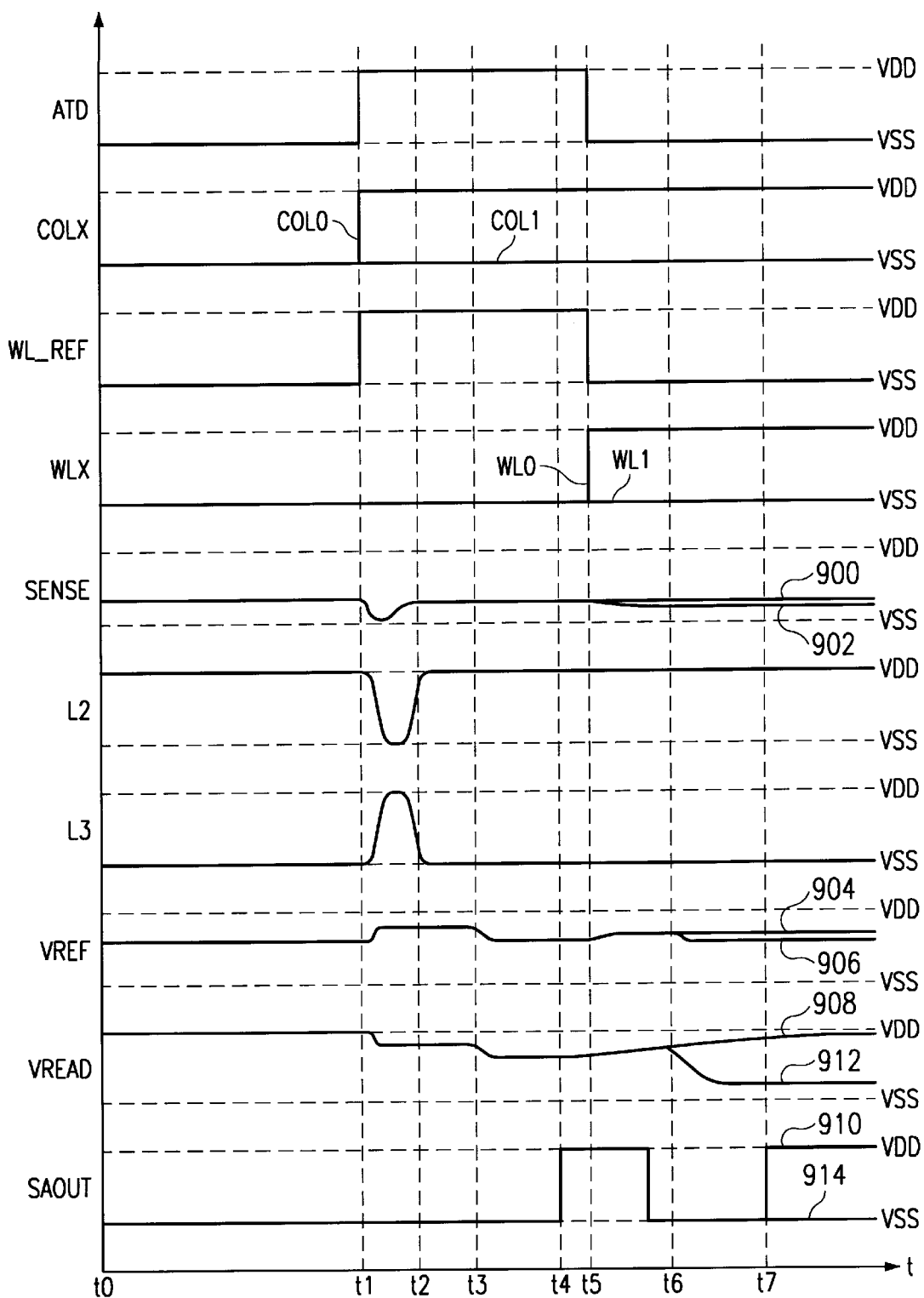
FIG. 9 is a timing diagram illustrating the operation of the second embodiment set forth in FIGS. 7 and 8.

FIG. 9 is a timing diagram illustrating the operation of the second embodiment set forth in FIGS. 7 and 8. A number of waveforms are set forth. The ATD waveform illustrates an address transition detect signal, which can be the same as that described in conjunction with FIG. 6. The COLX waveforms set forth the COL0 and COL1 signals used to select columns within the array 708. The WL_REF signal is used to enable the reference circuit 712. The WLX, like that in FIG. 6, illustrates the selection of word lines within the array 708. The SENSE waveform illustrates the potential on the sense line 710. The L2 and L3 waveforms illustrate the response of the L2 and L3 signals, previously described. The VREAD and VREF waveforms illustrate the responses of the read node 720 and reference node 718, respectively. The SAOUT waveform illustrates the resulting output of a differential amplifier, such as that set forth in FIG. 5, that includes a plus input coupled to the reference node 718, and a minus input coupled to the read node 720.

Various time periods are designated in FIG. 9, beginning with time t0. At time t0, no address transition has occurred, and the ATD signal is low. With the ATD signal low (and its inverse ATD_high) transfer gate T700 within the load stage 702 is turned off, and the read node 720 is isolated from the reference node 718. In addition, in the timing circuit of FIG. 8, the pull-down transistor N800 is turned on, coupling the input of inverter I802 (the L1 signal) to the VSS supply voltage. This forces the L2 signal high, and the L3 signal low, as shown at time t0 in FIG. 9. With the L2 signal high, pull-up transistor P800 is turned off, and does not effect the potential at the sense node 710.

Referring once again to FIG. 7, with the L2 signal high and the L3 signal low, transfer gate T702 is turned off, isolating the sense line 710 from the store node 724. Further, transistors N718, N720, and N722 are also turned off, and the gates of transistors N700 and N706 are isolated from one another, and the reference line 714 is isolated from the sense line 710.

Without an applied address, memory cells within the array are not selected, and the COL0, COL1, WL0, WL1, and WL_REF signals are low. Consequently, all of the column select transistors (N712 and N714), including the reference column select transistor N716, are turned off, and no current is drawn through the reference line 714 or sense line 710. In FIG. 9, it is assumed that a reference voltage VREF, is stored at the reference node 718 at time t0. Further, it is assumed that VREF is less than the VDD voltage by more than the threshold voltage of transistor P700. As a result, without current being drawn in the sense or reference lines (710 and 714), the read node 720 is pulled essentially to the VDD power supply voltage. With VREF less than VREAD at time t0, the SAOUT signal is low.

It is also assumed that at time t0, the store node 724 is charged to a bias potential. In response to this bias potential, the bias node 722 is decreased, and mirrored at the gate of transistor N700. Due to the bias at its gate, transistor N700 introduces a voltage drop between the read node 720 and the sense line 710. Consequently, the potential on the sense line 710 is at an initial sense potential, shown by the SENSE waveform in FIG. 9. It is noted that inverter I800 in the timing circuit of FIG. 8 is sized to have a relatively low threshold potential, lower than the initial sense potential. Thus, the L2 and L3 signals remain high and low, respectively.

At time t1, an address transition occurs. The ATD signal goes high (and the ATD_signal goes low). With the ATD signal high, and the ATD_signal low, transfer gate T700 in the load stage 702 is enabled, and the read node 720 is coupled to the reference node 718. Referring once again to FIG. 8, the low ATD_signal turns off transistor N800, freeing up the inverter chain I800–I802–I804 to be responsive to the potential on the sense line 710 (the SENSE potential).

In the memory access illustrated in FIG. 9, it is assumed that memory cell Q700 is accessed. Therefore, as the ATD signal pulses high, the COL0 will transition high, selecting the first bit line 726 (the bit line containing memory cell Q700). The COL1 signal remains low, maintaining the second bit line 728 in a de-selected state. Notably, any leakage current present on the first bit line 726 will now begin to be drawn through the sense line 710.

Also at time t1, the WL_REF signal will transition high, turning on transistor N716. The reference current is thus drawn in the reference line 714. As current is drawn in the sense line 710 and reference line 714, the potential on the sense line 710 (SENSE) will fall. In the example of FIG. 9 it is assumed that the SENSE signal falls below the threshold of inverter I800 in FIG. 8. The output of inverter I800 (L1) is driven high, and the outputs of inverters I802 and I804 follow, driving the signals L2 and L3 low and high, respectively.

With L2 low and L3 high, the second embodiment 700 is placed in a line charge state. Transfer gate T702 is enabled, and the store node 724 is coupled to the sense line 710. Transistors N718 and N720 are turned on, coupling the gate of transistor N700 to the gate of transistor N706. Finally, transistor N722 is turned on, coupling the sense line 710 to the reference line 714.

Referring now to FIG. 8, it is shown that the triggering of the inverter chains I800, I802 and I804 is self-terminating. The initial low SENSE state will propagate through inverters I800 and I802, resulting in the low L2 signal. The low L2 signal will begin to turn on transistor P800, pulling the sense line 710 (and the reference line 712 due to transistor N722) up to a precharge potential.

At time t2, the sense line 710 rises above the threshold voltage of inverter I800, and L2 and L3 will return to high and low voltage levels, respectively. This results in passgate T702 being turned off, trapping an initial charge precharge potential at the store node 724. Transistors N718 and N720 are turned off, and the equalization of the gates of transistors N700 and N706 ceases. Similarly, transistor N722 is turned off, terminating the equalization of the sense lines 710 and reference lines 714. It is noted that the precharge potential at the store node 724 is dependent upon the reference current and any leakage current.

The precharge potential is mirrored at the gate of transistor P706 within the second bias circuit 706. This results in the gates of transistors N700 and N706 receiving a bias voltage that is dependent upon the sense current and leakage currents. In this manner the sense line 710 and reference line 714 are initially charged, and a bias voltage, that is dependent upon the reference and any leakage current, is established at the gates of transistor N700 and N706.

At time t3, with the pull-up transistor P800 turned off, the reference current and any leakage current in the sense line 710 and reference line 714 will begin to draw the read node 720 (and reference node 718) to an adjusted reference voltage. In the particular embodiment of FIG. 9, the VREAD voltage initially falls below the VREF voltage, resulting in the SAOUT signal being driven to a high voltage.

At time t5, the ATD signal returns to a low level. Transfer gate T700 is turned off, and the read node 720 is isolated from the reference node 718. This stores the adjusted reference voltage in the reference node 718. In addition, in the timing circuit of FIG. 8, the pull-down transistor N800 is turned on, bringing the input of inverter I800 to the VSS voltage level. This maintains the L2 signal at a high level and the L3 signal at the low level, guaranteeing that the pull-up transistor P800 will be disabled, and the equalizing transistors N718, N720 and N722 will be turned off.

In response to the termination of the ATD pulse, the WL_REF signal returns low, and the selected word line (WL0 in the case of FIG. 9) goes high. With WL_REF low, transistor N716 is turned off, and the reference current ceases to be drawn through the reference line 714. With the WL0 signal high, the selected memory cell Q700 is accessed. At this point in time, a sense current from memory cell Q700 and any leakage current in the first bit line 726 is drawn through the sense line 710.

The amount of current drawn by the sense line 710 will vary according to the state of memory cell Q700. In the event memory cell Q700 is programmed, the sense line 710 current will be negligible. The response of the SENSE voltage to a programmed memory cell is shown as waveform 900 in FIG. 9. In the event the memory cell Q700 is erased, the amount of current drawn in the sense line 710 will be relatively high. The SENSE voltage will also fall. The response of the SENSE voltage to an erased memory cell is shown as waveform 902 in FIG. 9.

Also at time t5, the VREF and VREAD potentials begin to "split." Initially, the VREAD voltage rises above the VREF voltage, resulting in the SAOUT signal going low. In the event the accessed memory cell is programmed, the leakage current and negligible memory cell current will result in the sense cascode generating a high voltage at the read node 720. In the event the memory cell is erased, the leakage current and the relatively high sense current will result in the sense cascode generating a low voltage at the read node 720.

Following a delay after the low-to-high transition of the WL0 signal, at time t6, the potential of the VREF and VREAD signal will depend upon whether the accessed memory cell is erased or program. The response of the VREF signal to a programmed memory cell is shown as waveform 904. The response of the VREF signal to an erased memory cell is shown as waveform 906. Similarly, the response of the VREAD signal will depend upon whether the access memory cell is programmed or erased. The response of the VREAD signal for a programmed memory cell is shown as waveform 908. The VREAD signal will rise above the VREF signal, and the SAOUT signal will be driven low at time t7. The SAOUT response for a programmed memory cell is shown as waveform 914. The response of the VREAD signal for an erased memory cell is shown as waveform 912. When the memory cell is erased, the VREAD signal will fall below the VREF signal, resulting in the SAOUT signal being driven high at time t7. The SAOUT response for a programmed memory cell is shown as waveform 910.

Although the present invention has been described in detail, it should be understood that various changes, substitutions, and alterations could be made without departing from the spirit and scope of the invention as defined by the appended claims.

What is claimed is:

1. A semiconductor memory device sensing circuit, comprising:
   a read node;
   a reference node;
   a variable impedance device having
      a conductive path disposed between a first power supply voltage and the read node, and
      a control node for receiving a voltage and varying the impedance of the conductive path; and
   a gate device disposed between the read node and the reference node, the gate device coupling the read node to the reference node in a precharge operation, and isolating the read node from the reference node in a sense operation.

2. The circuit of claim 1, wherein:
   the variable impedance device includes an insulated gate field effect transistor (IGFET).

3. The circuit of claim 2, wherein:
   the variable impedance device includes a p-channel insulated gate field effect transistor (IGFET); and
   the first power supply voltage is a high power supply voltage.

4. The circuit of claim 1, wherein:
   the gate device includes an insulated gate field effect transistor (IGFET).

5. The circuit of claim 4, wherein:
   the gate device includes a p-channel IGFET.

6. The circuit of claim 4, wherein:
   the gate device includes a complementary IGFET transmission gate.

7. The circuit of claim 1, further including:
   a capacitor coupled to the reference node.

8. The circuit of claim 1, further including:
   a memory cell array coupled to the read node, the memory cell array including a plurality of memory cells, and coupling a memory cell to the read node in response to an applied address signal; and
   at least one reference circuit coupled to the read node, the reference circuit providing a reference current in response to a reference signal.

9. The circuit of claim 8, wherein:
   the memory cell array includes a plurality of electrically erasable programmable memory cells, each memory cell having a first state in which the memory cell provides a relatively low impedance path to a low power supply voltage, and having a second state, in which the memory cell provides a relatively high impedance path to the low power supply voltage.

10. The circuit of claim 8, further including:
    a sense line coupled to the memory cell array;
    a first bias circuit coupling the sense line to the read node, the first bias circuit including a first bias device having a variable impedance path coupled between the sense line and the read node;
    a reference line coupled to the reference circuit; and
    a second bias circuit coupling the reference line to the read node, the second bias circuit including a second bias device having a variable impedance path coupled between the reference line and the read node.

11. The circuit of claim 10, wherein:
    the first bias device includes a first IGFET having a source-drain path coupled between the sense line and the read node, the first bias circuit maintaining a generally constant bias voltage at the gate of the first IGFET during a sense cycle; and
    the second bias device includes a second IGFET having a source-drain path coupled between the reference line and the read node, the second bias circuit maintaining a generally constant bias voltage at the gate of the second IGFET during the sense cycle.

12. The circuit of claim 11, wherein:
    the first bias circuit includes,
       the first IGFET being an n-channel IGFET having a source coupled to the sense line and a drain coupled to the read node, a first load circuit coupled to a high power supply voltage, and a third IGFET having a source coupled to the sense line, a drain coupled to the first load circuit, and a gate coupled to the gate of the first IGFET.

13. The circuit of claim 12, wherein:

the first load circuit includes at least one p-channel IGFET having a source coupled to the high power supply voltage, a gate coupled to a low power supply voltage, and a drain coupled to the drain of the third IGFET.

14. The circuit of claim 11, wherein:

the second bias circuit includes, the second IGFET being an n-channel IGFET having a source coupled to the reference line and a drain coupled to the read node, a second load circuit coupled to a high power supply voltage, and a fourth IGFET having a source coupled to the reference line, a drain coupled to the second load circuit, and a gate coupled to the gate of the second IGFET.

15. The circuit of claim 14, wherein:

the second load circuit includes at least one p-channel IGFET having a source coupled to the high power supply voltage, a gate coupled to a low power supply voltage, and a drain coupled to the drain of the fourth IGFET.

16. In a semiconductor memory having a plurality of memory cells arranged in rows and columns, the memory cells drawing a sense current when accessed, a method for sensing data stored in the random access memory, comprising the steps of:

establishing a reference voltage based upon a reference current and any leakage current;

storing the reference voltage;

establishing a read voltage based upon the sense current of a memory cell and the leakage current; and comparing the read voltage to the reference voltage.

17. The method of claim 16, wherein:

the step of establishing a reference voltage includes, providing a first current path between a column of memory cells and a load, while the memory cells of the column are de-selected, and providing a second current path between a reference circuit and the load.

18. The method of claim 17, wherein:

providing the first current path includes activating column access circuitry in the semiconductor memory.

19. The method of claim 16, wherein:

the step of establishing a reference voltage includes shorting a reference node to a read node.

20. The method of claim 16, wherein:

the step of establishing a reference voltage includes charging a capacitor with the reference voltage.

21. The method of claim 16, wherein:

the step of establishing a read voltage includes providing a third current path between a column of the memory cells and a load, while a memory cell of the column is selected.

22. The method of claim 21 wherein:

providing the third current path includes activating column access circuitry in the semiconductor memory and at least one word line in the semiconductor memory.

23. The method of claim 16, wherein:

the step of comparing the read voltage to the reference voltage includes applying the reference voltage to a first input of a differential amplifier, and applying the read voltage to a second input of the differential amplifier.

24. An electrically erasable and programmable read only memory (EEPROM), comprising:

an active load circuit including an active load device, a read node and a reference node, and a gating device coupled between the read node and the reference node, the impedance of the active load device being controlled by the potential at the reference node;

a memory cell array including a plurality of EEPROM memory cells;

a first bias circuit coupled between the memory cell array and the active load device;

a reference circuit, the reference circuit providing a reference current when enabled; and a second bias circuit coupled between the reference circuit and the active load device.

25. The EEPROM of claim 24, wherein:

the active load circuit includes a p-channel insulated gate field effect transistor (IGFET) having a source coupled to a high power supply voltage, a gate coupled to the reference node, and a drain coupled to the read node.

26. The EEPROM of claim 24, wherein:

the gating device includes a transfer gate of complementary IGFETs disposed in parallel, and receiving opposite polarity signals on their respective gates.

27. The EEPROM of claim 24, wherein:

the memory cell array includes the plurality of EEPROM memory cells arranged in rows and columns, the EEPROM memory cells of like columns being coupled to bit lines, at least one bit line being coupled to the first bias circuit by column decoder circuits, and the EEPROM memory cells of like rows being coupled to word lines.

28. The EEPROM of claim 27, wherein:

the EEPROM cells are one-transistor EEPROM cells having drains coupled to their respective bit lines, gates coupled to word lines, and sources commonly coupled to a source node.

29. The EEPROM of claim 24, wherein:

the first bias circuit includes a first bias IGFET having a gate and a source-drain path coupled between the read node and the memory cell array, and a first variable bias level circuit that provides a voltage at the gate of the first bias IGFET according to the potential at a store node; and the second bias circuit includes a second bias IGFET having a gate and a source-drain path coupled between the read node and the reference circuit, and a second variable bias level circuit that provides a voltage at the gate of the second bias IGFET according to the potential at the store node.

30. The EEPROM of claim 29, further including:

a bias device equalization circuit coupled between the gates of the first and second bias IGFETs, the bias device equalization circuit coupling the gate of the first bias IGFET to the gate of the second bias IGFET when enabled.

31. The EEPROM of claim 29, further including:

the first bias IGFET being coupled to the memory cell array by a sense line;

a store node gate disposed between the sense line and the store node, the store node gate coupling the sense line to the store node when enabled.

32. The EEPROM of claim 31, further including:

a timing charge circuit including a charge device coupled to the sense line, the charge device charging the sense line to an initial charge voltage, and enabling the store node gate, the established voltage level being sampled and used as a reference to a differential amplifier that maintains the established voltage level on the sense line.

33. The EEPROM of claim 32, wherein:

the timing charge circuit includes
- a charge transistor having a source coupled to a power supply voltage, a drain coupled to the sense line, and a gate,
- a first inverter having an input coupled to the sense line and an output, and
- a second inverter having an input coupled to the output of the first inverter and an output coupled to the gate of the charge transistor and the store node gate, the output of the second inverter enabling the store node gate.

34. The EEPROM of claim 29, wherein:

the first bias circuit includes a first current mirror IGFET having a source coupled to one power supply, a gate coupled to a bias node, and a drain coupled to the gate of the first bias IGFET;

the second bias circuit includes a second current mirror IGFET having a source coupled to the one power supply, a gate coupled to the bias node, and a drain coupled to the gate of the second bias IGFET; and wherein the potential at the bias node is dependent upon the potential at the store node.

35. The EEPROM of claim 34, wherein:

the first bias circuit further includes a store node sense IGFET having a drain coupled to the gate of the first current mirror IGFET, a gate coupled to the store node, and a source coupled to another power supply.

36. The EEPROM of claim 34, further including:

the first bias IGFET being coupled to the memory cell array by a sense line;

the second bias IGFET being coupled to the reference circuit by a reference line; and a line equalization circuit coupled between the sense line and the reference line, the line equalization circuit coupling the sense line to the reference line when enabled.

\* \* \* \* \*